US008044667B2

(12) United States Patent
Cortigiani et al.

(10) Patent No.: US 8,044,667 B2

(45) Date of Patent: Oct. 25, 2011

(54) FAILURE DETECTION FOR SERIES OF ELECTRICAL LOADS

(75) Inventors: Fabrizio Cortigiani, Padua (IT); Andrea Logiudice, Padua (IT); Andreas Eder, Weissenstein (AT)

(73) Assignee: Infineon Technologies AG, Neubiberg (DE)

( * ) Notice: Subject to any disclaimer, the term of this patent is extended or adjusted under 35 U.S.C. 154(b) by 395 days.

(21) Appl. No.: 12/426,577

(22) Filed: Apr. 20, 2009

(65) Prior Publication Data

US 2010/0264828 A1 Oct. 21, 2010

(51) Int. Cl.
*G01R 31/08* (2006.01)

(52) U.S. Cl. ........................................ 324/522; 324/528

(58) Field of Classification Search ........................ None
See application file for complete search history.

(56) References Cited

U.S. PATENT DOCUMENTS

| | | | | |
|---|---|---|---|---|
| 4,394,647 | A * | 7/1983 | Van Dine | 340/645 |
| 5,444,390 | A * | 8/1995 | Bartlett et al. | 324/762.07 |
| 6,888,454 | B2 | 5/2005 | Kurose | |
| 2007/0159750 | A1 * | 7/2007 | Peker et al. | 361/93.1 |

* cited by examiner

*Primary Examiner* — Minh N Tang

(74) *Attorney, Agent, or Firm* — Slater & Matsil, L.L.P.

(57) ABSTRACT

An apparatus for detecting failures in an illumination device includes at least two light emitting diodes connected in series. The apparatus includes a first, a second, and a third circuit node for interfacing the illumination device such that the voltage drop across at least two light emitting diodes is applied between the first and the second circuit node and a fraction of the voltage drop is applied between the second and the third circuit node. An evaluation unit is coupled to the first, the second, and the third circuit node and configured to assess whether the electric potential present at the third circuit node is within a pre-defined range of tolerance about a nominal value that is defined as a pre-defined fraction of the potential difference present between the first and the second circuit node.

20 Claims, 3 Drawing Sheets

FAILURE DETECTION FOR SERIES OF ELECTRICAL LOADS

TECHNICAL FIELD

The invention relates to the field of failure detection to detect failures, such as short circuits or open circuits, of electrical loads, especially to detect failures of light emitting diodes (LEDs) in a chain of LEDs connected in series.

BACKGROUND

Illumination devices (e.g., lamps) that comprise light emitting diodes (LEDs) as luminescent components usually can not simply be connected to a voltage supply but have to be driven by special driver circuits (or control circuits) providing a defined load current to the LEDs in order to provide a desired radiant power (radiant flux). Since a single LED exhibits only small forward voltages (from about 1.5 V for infrared GaAs LEDs ranging up to 4 V for violet and ultraviolet InGaN LEDs) compared to commonly used supply voltages (for example, 12 V, 24 V and 42 V in automotive applications) several LEDs are connected in series to form so-called LED chains.

In many applications it is desirable to have a fault detection included in the driver circuits (or control circuits) that allows for detecting defective LEDS in the LED chains connected to the driver circuit. An LED can be regarded as a two-terminal network. A defective LED becomes manifest in either an open circuit or a short circuit between the two terminals. If one LED of a LED chain fails as an open circuit this is easy to detect since the defective LED interrupts the current for the whole LED chain. If one LED of a LED chain fails as a short circuit only the defective LED stops radiating which in some applications might not be a problem. However, other applications require the radiant power to stay within a narrow range.

Thus there is a general need for a circuit arrangement capable of detecting faults within a LED chain including short circuit defects.

SUMMARY OF THE INVENTION

One example of the invention relates to an apparatus for detecting failures in an illumination device comprising at least two light emitting diodes connected in series. The apparatus comprises a first, a second, and a third circuit node for interfacing the illumination device such that the voltage drop across at least two light emitting diodes is applied between the first and the second circuit node and a fraction of the voltage drop is applied between the second and the third circuit node. An evaluation unit is coupled to the first, the second, and the third circuit node and configured to assess whether the electric potential present at the third circuit node is within a pre-defined range of tolerance about a nominal value that is defined as a pre-defined fraction of the potential difference present between the first and the second circuit node.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In many applications it is desirable to have a fault detection included in the driver circuits (or control circuits) that allows for detecting defective LEDS in the LED chains connected to the driver circuit. A defective LED becomes manifest in either an open circuit or a short circuit between the two terminals of the defective LED. If one LED of a LED chain fails as an open circuit the defective LED interrupts the current for the whole LED chain which is easy to detect, for example, by monitoring the load current of the LED chain. If one LED of a LED chain fails as a short circuit only the defective LED stops radiating and the overall voltage drop across the LED chain decreases by the forward voltage of one LED. A short circuit defect may therefore be detected by monitoring the overall voltage drop across the LED chain. If this overall voltage drop falls below a constant threshold voltage, a defective LED (which has failed as a short circuit) is detected.

A problem inherent with such a concept of short circuit fault detection is that the voltage drop across a LED chain does not only decrease due to a short circuit defect of one LED but may also vary due to variations of temperature as well as due to aging effects. As a result, it is possible that a fault can be detected although all LEDs are good or that a defective LED will not be detected. This may be the case especially in applications with wide temperature ranges, for example in automotive applications where incandescent lamps are increasingly substituted by illumination devices based on LEDs.

Figure 1:
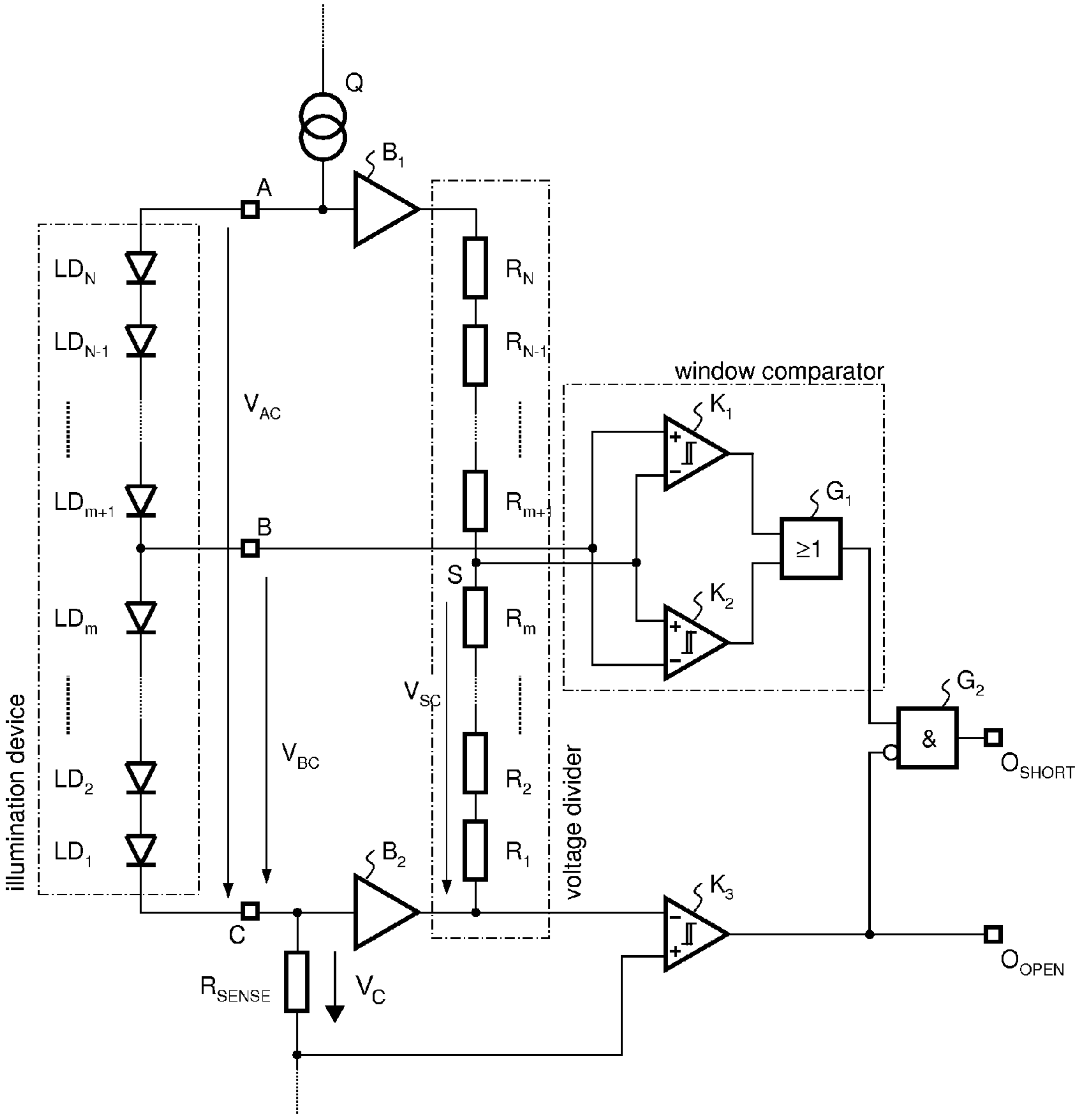
FIG. 1 illustrates a first example of the invention comprising a voltage divider for providing the nominal value.

To remedy the problems discussed above, a novel circuit is proposed for detecting failures in an illumination device comprising at least two light emitting diodes connected in series (illumination device comprising a LED chain). As one example of the present invention, FIG. 1 illustrates a circuit that comprises a first circuit node A, a second circuit node C, and a third circuit node B for interfacing the illumination device such that the voltage drop $V_{AC}$ across the chain of light emitting diodes $LD_1, LD_2, \ldots, LD_N$ is applied between the circuit nodes A and C and a fraction $V_{BC}$ of the voltage drop $V_{AC}$ is applied between the circuit nodes B and C. That is, the chain of LEDs $LD_1, LD_2, \ldots, LD_N$ has an intermediate tap connected to circuit node B. The ratio $k_{nominal}$ between the fractional voltage $V_{BC}$ and the voltage drop $V_{AC}$ across the LED chain is (approximately)

$$k_{nominal}=m/N,$$

whereby N is the total number of LEDs in the chain and m the number of LEDs between the intermediate tap of the LED chain and circuit node C. The ratio $k_{nominal}$ is therefore a predefined value dependent on the physical set-up of the LED chain.

The circuit of FIG. 1 further comprises an evaluation unit coupled to the circuit nodes A, B, and C. The evaluation unit is configured to assess whether the electric potential $V_B$ present at the third circuit node B is within a pre-defined range of tolerance about a nominal value $k_{nominal} \cdot V_{AC}$. As mentioned above, the nominal value $k_{nominal} \cdot V_{AC}$ is defined as a pre-defined fraction $k_{nominal}$=m/N of the potential difference $V_{AC}$ between the circuit nodes A and C.

By using a pre-defined ratio $k_{nominal}$ of the voltage drop $V_{AC}$ across the LED chain as criterion instead of using a fixed voltage threshold as mentioned above for assessing whether the LED chain comprises defective LEDs the fault detection becomes more reliable and more robust against variations of the forward voltages of the single LEDs, whereby these variations may be, inter alia, due to changes in temperature or due to aging effects.

As illustrated in the example of FIG. 1 the evaluation unit may comprise a voltage divider coupled to the circuit nodes A and C and configured to provide at an intermediate tap S the above mentioned pre-defined fraction $V_{SC}=k_{nominal} \cdot V_{AC}$ of the potential difference $V_{AC}$ between circuit nodes A and C. That is, the voltage divider provides a fractional voltage $V_{SC}$ that is (approximately) equal to the fractional voltage $V_{BC}$ provided by the LED chain in the case of all LEDs of the chain are fully functional.

In case of a short circuit between the anode terminal and the cathode terminal of at least one LED of the LED chain the actual ratio $k=V_{BC}/V_{AC}$ will change to either:

$$k=m(N-1), \text{ thus } k>k_{nominal}$$

in case the defective LED is located between the circuit nodes A and B or, $$k=(m-1)/(N-1), \text{ thus } k<k_{nominal}$$

in case the defective LED is located between the circuit nodes B and C. When evaluating both of the above mentioned cases a localization of the defective LED may be implemented. This may be especially useful if the illumination device comprises two spatially separate LED sub-chains connected in series and the circuit node B connects to the illumination device in between these sub-chains. It is thus possible to locate a defective LED in either the first or the second LED sub-chain.

By checking whether the fractional voltage $V_{BC}=k \cdot V_{AC}$ is approximately equal to the voltage $V_{SC}=k_{nominal} \cdot V_{AC}$ the integrity of the LED chain can be tested. In practice "approximately equal" means that the voltage $V_{BC}=k \cdot V_{AC}$ is within a given range of tolerance $\Delta V$ about the voltage $V_{SC}=k_{nominal} \cdot V_{AC}$, for example, $$V_{BC} \in [V_{SC}-\Delta V, V_{SC}+\Delta V],$$

which is tantamount to:

$$k \in [k_{nominal}-\Delta k, k_{nominal}+\Delta k],$$

if only the ratios are considered (note: $\Delta V=\Delta k \cdot V_{AC}$).

The above described comparison between the voltages $V_{BC}$ and $V_{SC}$ may be implemented by using a window comparator with a relatively "narrow" window compared to the absolute value of the fractional voltage $V_{BC}$ (or $V_{SC}$). In the example of FIG. 1 the window comparator is realized by using two comparators $K_1$ and $K_2$, each having a hysteresis $\Delta V$, and an OR-gate $G_1$ that combines the output signals of the comparators $K_1$ and $K_2$. The output of the OR gate $G_1$ indicates whether a defective LED is detected in the LED chain $L_1$, $L_2$, . . . , $L_N$ or whether the LED chain $L_1$, $L_2$, . . . , $L_N$ is fully functional.

Figure 2:
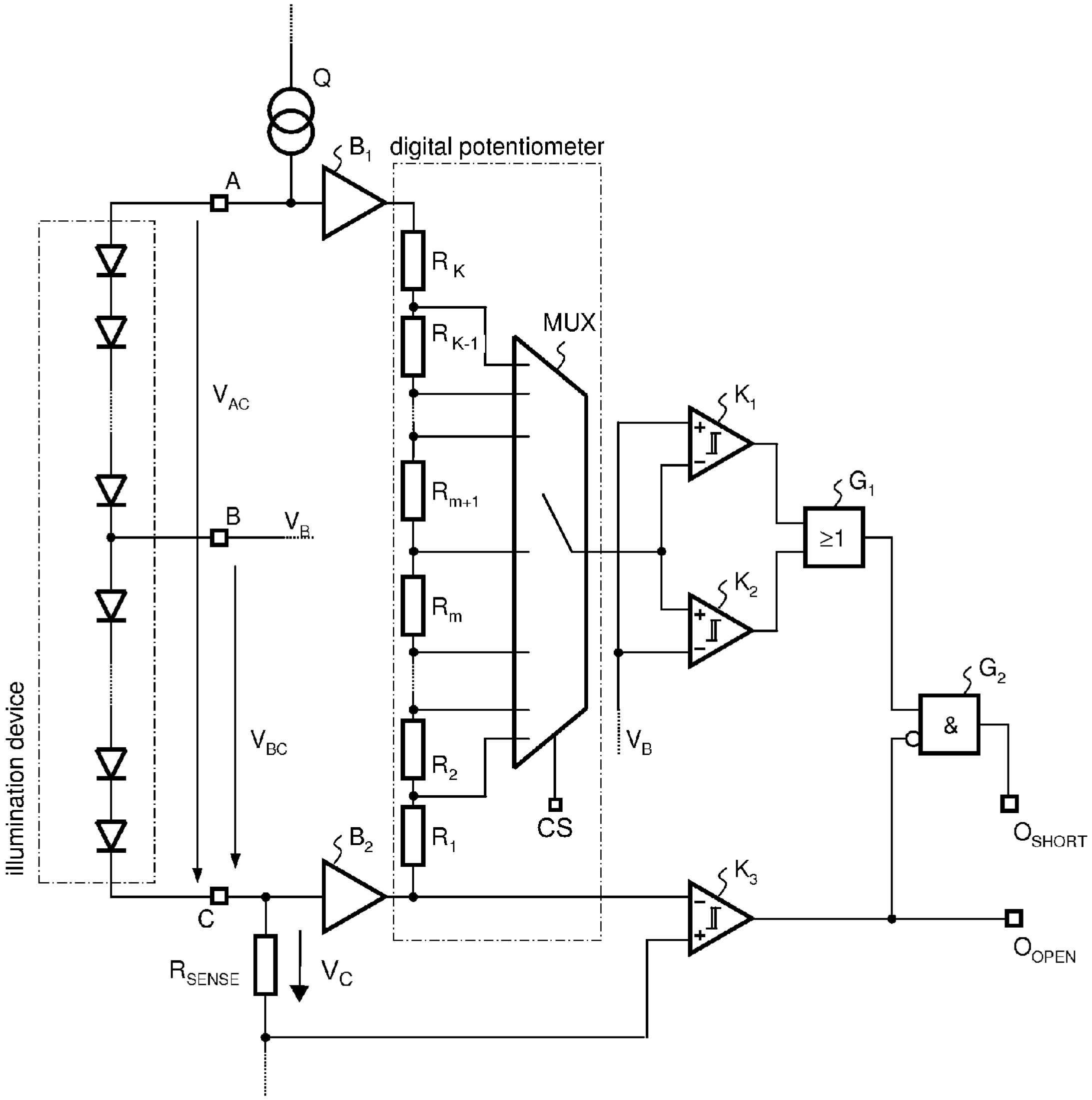
FIG. 2 illustrates a second example of the invention comprising a voltage divider having a plurality of intermediate taps and a multiplexer for selecting an appropriate intermediate tap for providing the nominal value.

In the example of FIG. 1 the resistive voltage divider comprises the same number of resistors as LEDs that are present in the illumination device. However, there is no need for a certain number of resistors provided that the desired division ratio $k_{nominal}$ can be provided by the voltage divider. This result can also be achieved by a resistive voltage divider comprising a potentiometer. In the example of FIG. 2 the resistive voltage divider of FIG. 1, which provides a fixed division ratio of m/N, is replaced by a digital potentiometer comprising a series of resistors $R_1$, $R_2$, . . . , $R_K$ (for example K=256) of equal resistance whereby the circuit nodes between two neighboring resistors are tapped by a multiplexer MUX. That is, the multiplexer MUX connects, dependent on a (for example, 8-bit) control signal CS, to a selectable circuit node between two neighboring resistors thus setting the nominal division ratio $k_{nominal}$. In case of an 8-bit digital potentiometer the ratio can be set in steps of 1/255 (approximately 0.39 percent) of the aggregate value.

The use of a digital potentiometer allows for setting the nominal ratio $k_{nominal}$ to a value that is appropriate for the connected illumination device and thus allows for the use of a large variety of different illumination devices.

In order to be able to detect not only short circuit defects but also open circuit defects, both examples of FIG. 1 and FIG. 2 may provide a circuit for detecting whether the load current flowing through the illumination device exceeds a given nominal value or not. In the illustrated examples a current measurement signal $V_C$ is provided by a shunt resistor $R_{sense}$ connected in series to the illumination device (or alternatively might be included in the illumination device). However, other current measurement means can be employed. In case the load current of the illumination device is switched by a MOSFET, a sense-FET arrangement may be used for providing a signal representing the load current. In some applications a signal representing the load current may be tapped directly in the current source circuit that supplies the load current to the illumination device (see current source Q in FIGS. 1 and 2).

In the examples of FIGS. 1 and 2 the current measurement signal is compared to a threshold value using a comparator $K_3$, whereby the threshold value is determined by the hysteresis of the comparator $K_3$. The output $O_{OPEN}$ of comparator $K_3$ indicates (by showing a logic level "high") whether the current measurement signal $V_C$ is below the threshold which means that no load current flows through the illumination device due to an open circuit defect of a LED.

In order to inhibit an erroneous detection of a short circuit the output of the window comparator (comprising $K_1$, $K_2$, and $G_1$) may be combined with the output signaling an open circuit by means of a further gate $G_2$ such that the output of the window comparator is only gated to an output terminal $O_{SHORT}$ if comparator $K_3$ does not signal an open circuit. In the illustrated examples the gate $G_2$ is an AND gate with one inverted input. However, it is clear to a person of ordinary skill that other types of gates can be used for implementing the same functionality. Additionally different logic ("high" or "low") levels can be used for signaling defective LEDs.

Figure 3:
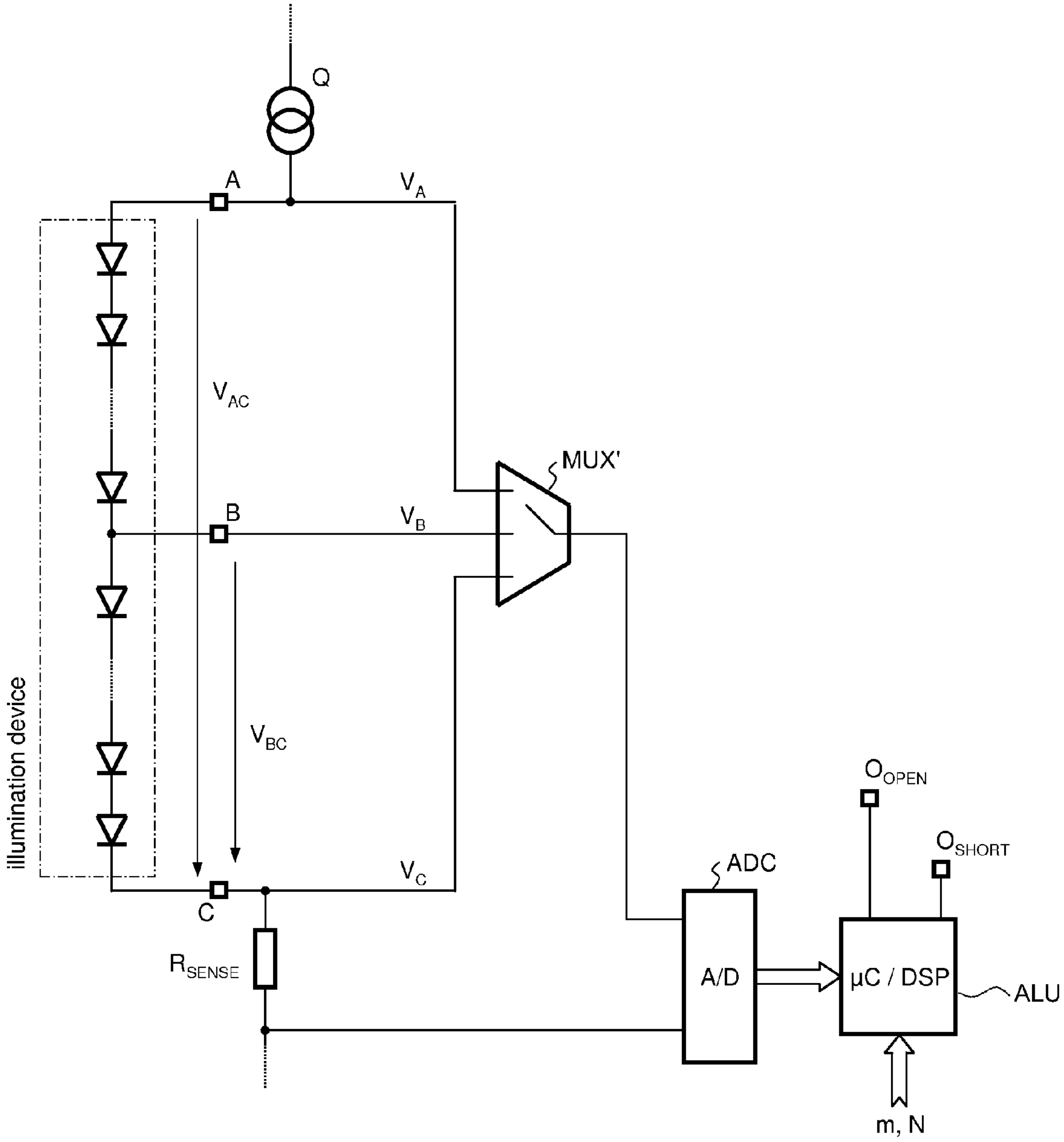
FIG. 3 illustrates a third example of the invention comprising analog-to-digital conversion means and an arithmetic logic unit for assessing the illumination device.

A further example of the present invention is illustrated in FIG. 3. This example makes use of at least one analog-to-digital converter ADC and an arithmetic logic unit ALU (which might be included in a micro controller or a digitals signal processor). In the example of FIG. 3 the function provided by the window comparator ($K_1$, $K_2$, $G_1$) is digitally implemented in the arithmetic logic unit ALU. Therefore the electric potentials $V_A$, $V_B$, and $V_C$ present at the circuit nodes A, B, and C, respectively, are digitized either parallel using three analog-to-digital converters or sequentially by using a multiplexer MUX' that sequentially connects one analog-to-digital converter ADC to circuit node A, B, and C, respectively. The multiplexer MUX' and the analog-to-digital converter ADC may also be controlled by the arithmetic logic unit ALU. The arithmetic logic unit ALU receives digital representations of the electric potentials $V_A$, $V_B$, and $V_C$ and is programmed to calculate the voltage drop $V_{AC}$ across the LED chain, namely:

$$V_{AC}=V_A-V_C,$$

and the tapped fractional voltage, $$V_{BC}=V_B-V_C.$$

Having calculated the values of the voltages $V_{AC}$ and $V_{BC}$ the actual value $V_{BC}$ can be compared to the nominal value $k_{nominal}\cdot V_{AC}$ as already explained above with reference to the examples of FIGS. 1 and 2. The factor $k_{nominal}$ can be set to $k_{nominal}=m/N$, whereby N is the total number of LEDs in the LED chain and m is the number of LEDs connected between the circuit nodes B and C. Furthermore, the digital representation of the potential $V_C$ which can be used as a current measurement signal analogous to the examples of FIGS. 1 and 2. Consequently, the digital representation of the potential $V_C$ can be used for testing whether an open circuit defect is present in one of the LEDs which is the case when $V_C$ does not exceed a given threshold value $V_{TH}$.

An exemplary algorithm performed by the arithmetic logic unit ALU is as follows:

if $V_C>V_{TH}$ then
calculate $V_{AC}$ and $V_{BC}$;
calculate $V_{SC}=m\cdot V_{AC}/N$;

if $V_{BC}<(V_{SC}-\Delta V)$ or $V_{BC}>(V_{SC}+\Delta V)$ then signal short circuit;
else
signal open circuit.

A person of ordinary skill will see that the above algorithm can be modified in various ways without substantially changing its effective function. Depending on the hardware (e.g., the arithmetic logic unit ALU) that is actually used, the optimal implementation of the above will vary due to the specific requirements of the hardware. For example an alternative implementation may be as follows:

if $V_C>V_{TH}$ then
calculate $V_{AC}$ and $V_{BC}$;
calculate $k=V_{BC}/V_{AC}$;
calculate $k_{nominal}=m/N$;

if $k<(k_{nominal}-\Delta k)$ or $k>(k_{nominal}+\Delta k)$ then signal short circuit;
else
signal open circuit.

The failure detection circuits as described hereinabove can be combined with a driver circuit configured to supply the illumination device with a desired load current. A current source Q shown in each of the FIGS. 1 to 3 can be regarded as part of a driver circuit. To decouple the failure detection circuit from the illumination device buffers $B_1$ and $B_2$ (impedance converters) having a high input impedance may be employed to avoid bypassing of a part of the load current via the voltage dividers of FIGS. 1 and 2. However, if the total resistance of the voltage is high enough, the buffers may be omitted and substituted by a direct connection between the voltage dividers and the illumination device. Buffers may also be connected upstream to the analog-to-digital-converter ADC in the example of FIG. 3 if the input impedance of the analog-to-digital-converter ADC is not high enough.

Although various examples for realizing the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

What is claimed is:

1. An apparatus for detecting failures in an illumination device comprising at least two light emitting diodes connected in series, the apparatus comprising:
- a first circuit node, a second circuit node, and a third circuit node for interfacing the illumination device such that a voltage drop across the at least two light emitting diodes is applied between the first and the second circuit node and a fraction of the voltage drop is applied between the second and the third circuit node; and
- an evaluation unit coupled to the first, the second, and the third circuit node and configured to assess whether an electric potential present at the third circuit node is within a pre-defined range of tolerance about a nominal value that is defined as a pre-defined fraction of the voltage drop present between the first and the second circuit node.

2. The apparatus of claim 1, wherein the evaluation unit comprises a measurement circuit configured to provide a signal representing a load current flowing through the illumination device.

3. The apparatus of claim 2, wherein the evaluation unit comprises a comparator configured to provide a first output signal indicating whether the illumination device comprises an open circuit.

4. The apparatus of claim 1, wherein the evaluation unit comprises a voltage divider coupled to the first and the second circuit node and configured to provide, the pre-defined fraction of the voltage drop present between the first and the second circuit node.

5. The apparatus of claim 1, wherein the evaluation unit comprises a window comparator receiving as input signals the electric potential present at the third circuit node and the pre-defined fraction of the voltage drop present between the first and the second circuit node.

6. The apparatus of claim 5, wherein the evaluation unit further comprises:
- a measurement circuit configured to provide a signal representing the load current flowing through the illumination device; and
- a comparator configured to provide, dependent on a signal representing a load current flowing through the illumination device, a first output signal indicating whether the illumination device comprises an open circuit.

7. The apparatus of claim 6, wherein the evaluation unit further comprises a logic circuit that is configured to provide a second output signal indicating whether the illumination device comprises a short circuit, the second output signal representing the output of the window comparator in case the first output signal does not indicate an open circuit.

8. The apparatus of claim 1, wherein the evaluation unit further comprises:
- a voltage divider coupled to the first and the second circuit node and comprising a plurality of intermediate taps; and a multiplexer configured to select one of the intermediate taps according to a control signal for connecting it to an output of the multiplexer, the electric potential thus provided at the output of the multiplexer forming the predefined fraction of the voltage drop present between the first and the second circuit node.

9. The apparatus of claim 1, wherein the evaluation unit comprises:

an analog-to-digital conversion circuit coupled to the first, the second, and the third circuit node and configured to provide digital representations of the electric potentials present at the first, the second and the third circuit node, respectively.

10. The apparatus of claim 9, wherein the analog-to-digital conversion circuit comprises a multiplexer and an analog-to-digital converter coupled such that the multiplexer subsequently supplies the electric potential present at first, the second and the third circuit node, respectively, to the analog-to-digital converter for providing digital representations of the electric potentials.

11. The apparatus of claim 9, wherein the evaluation unit further comprises an arithmetic logic unit connected to the analog-to-digital conversion circuit that is configured to:

calculate the predefined fraction of the voltage drop present between the first and the second circuit node; and decide whether digital representation of the electric potential present at the third circuit node is greater than a calculated fraction plus an allowable tolerance value or smaller than the calculated fraction minus the allowable tolerance value.

12. The apparatus of claim 11, wherein the arithmetic logic unit is further configured to compare one of the digital representations received from the analog-to-digital conversion circuit with a threshold, the result of the threshold indicating whether the illumination device comprises an open circuit.

13. The apparatus of claim 11, wherein the arithmetic logic unit is further configured to indicate a short circuit present in the illumination device in case no open circuit is detected and the digital representation of the electric potential present at the third circuit node deviates by more than the allowable tolerance value from the calculated fraction.

14. An illumination device comprising:

a plurality of light emitting diodes connected in series;

a plurality of resistors connected in series, the series connected plurality of resistors being coupled in parallel with the series connected plurality of light emitting diodes; and a comparator circuit with a first input coupled to a first intermediate point between ones of the series connected light emitting diodes and a second input coupled to a second intermediate point between ones of the series connected resistors.

15. The device of claim 14, further comprising a multiplexer coupled between the series connected resistors and the comparator circuit, the multiplexer coupling one of a plurality of second intermediate points to the second input of the comparator circuit.

16. The device of claim 14, wherein the number of resistors in the plurality of resistors is the same as the number of light emitting diodes in the plurality of light emitting diodes.

17. The device of claim 14, further comprising a circuit that measures a current through the series connected light emitting diodes.

18. A method for detecting failures in an illumination device comprising a plurality of light emitting diodes, the method comprising:

sensing a voltage drop across the light emitting diodes;

sensing a fraction of the voltage drop across the light emitting diodes at an intermediate tap of a series circuit of light emitting diodes; and assessing whether the sensed fraction is within a pre-defined range of tolerance about a nominal value that is defined as a pre-defined fraction of the sensed voltage drop.

19. The method of claim 18, wherein the pre-defined fraction of the sensed voltage drop is tapped at an intermediate tap of a voltage divider receiving the same voltage drop as the at least two light emitting diodes.

20. The method of claim 18, wherein the predefined fraction is the voltage drop:

divided by the number of light emitting diodes present in the series circuit of light emitting diodes; and multiplied by the number of light emitting diodes present in the series of light emitting diodes on a low side of the intermediate tap of the illumination device.

* * * * *